(12) United States Patent
Lin

(10) Patent No.: US 7,439,784 B2
(45) Date of Patent: Oct. 21, 2008

(54) CHARGE PUMP FOR REDUCING CURRENT MISMATCH

(75) Inventor: Ang-Sheng Lin, Kaohsiung (TW)

(73) Assignee: MediaTek Inc., Hsin-Chu (TW)

( * ) Notice: Subject to any disclaimer, the term of this patent is extended or adjusted under 35 U.S.C. 154(b) by 41 days.

(21) Appl. No.: 11/617,734

(22) Filed: Dec. 29, 2006

(65) Prior Publication Data

US 2008/0157834 A1 Jul. 3, 2008

(51) Int. Cl.
*H03L 7/06* (2006.01)
(52) U.S. Cl. .................... 327/157; 327/148
(58) Field of Classification Search ......... 327/147–150, 327/156–159
See application file for complete search history.

(56) References Cited

U.S. PATENT DOCUMENTS

| | | | | |
|---|---|---|---|---|
| 6,043,717 A * | 3/2000 | Kurd | .......................... | 331/17 |
| 6,229,362 B1 * | 5/2001 | Choi | .......................... | 327/157 |
| 6,242,956 B1 * | 6/2001 | McCollough et al. | ........ | 327/159 |
| 6,262,610 B1 * | 7/2001 | Lo et al. | ...................... | 327/157 |
| 6,850,102 B2 * | 2/2005 | Hsu et al. | .................... | 327/157 |
| 7,034,588 B2 | 4/2006 | Cheung et al. | | |
| 7,148,757 B2 * | 12/2006 | Chiu | .......................... | 331/16 |
| 7,184,510 B2 * | 2/2007 | Jung | .......................... | 375/374 |
| 7,202,718 B2 * | 4/2007 | Lindner et al. | .............. | 327/157 |
| 2003/0038661 A1 * | 2/2003 | Chokkalingam et al. | .... | 327/157 |
| 2004/0012425 A1 * | 1/2004 | Hsu | .......................... | 327/157 |
| 2005/0162213 A1 * | 7/2005 | Yoshimura | ................... | 327/536 |

* cited by examiner

*Primary Examiner*—Lincoln Donovan
*Assistant Examiner*—Thomas J Hiltunen
(74) *Attorney, Agent, or Firm*—Winston Hsu

(57) ABSTRACT

A charge pump circuit is disclosed, including: a dummy current path comprising a first junction node; a normal current path comprising a second junction node; a switch, coupled between the dummy current path and the normal current path; wherein when the switch is closed a first voltage is at the first junction node and the second junction node, and when the switch is open a second voltage is at the first junction node; and a comparator, for comparing the first voltage and the second voltage to balance a current mismatch of the charge pump circuit. The disclosed charge pump circuit can be implemented in a phase locked loop system.

15 Claims, 5 Drawing Sheets

CHARGE PUMP FOR REDUCING CURRENT MISMATCH

BACKGROUND

The present invention relates to charge pumps, and more particularly, to a charge pump architecture and related method for reducing a current mismatch.

Charge pumps are essential components of phase locked loops (PLLs). A charge pump conventionally consists of a capacitor, coupled between an up circuit and a down circuit. A current source for charging the capacitor is provided to the up circuit in response to an up pulse, and a current sink for discharging the capacitor is provided to the down circuit in response to a down pulse. The amount of charge pumped to or from the capacitor depends on the durations of the up pulse and down pulse respectively.

If the value of the current sink does not match the value of the current source, i.e. there is a current mismatch, there will be some degradation in the overall performance of the charge pump. In a phase locked loop (PLL) system, for example, a current mismatch results in a net charge being applied to the capacitor, so the phase and frequency of a feedback clock will not match the phase and frequency of a reference clock.

Please refer to FIG. 1. FIG. 1 is a diagram of a related art charge pump circuit 140 coupled to a loop filter 138. Transistors 102 and 106 provide a current source. Transistors 124 and 126 provide a current sink. Transistor 112 forms an up circuit for passing the current source, and transistor 116 forms a down circuit for passing a current sink. Transistors 100 and 104 steer a reference current. During idle times, i.e. when the up/dn pulse is low, transistors 110 and 114 will be operational. Current from the transistor 102/106 can be steered to charge the sampling capacitor 122 to produce a stored voltage VSTORE.

When switches 118 and 120 are turned on, they will inject a mismatch current to 122 and VSTORE will bias the transistor 126. When there is a current mismatch where the current sink is less than the current source, V->VSTORE, the capacitor will be charged and more current will be sunk through the transistor 126. When there is a current mismatch where the current sink is greater than the current source, V-<VSTORE so the capacitor 122 will be discharged and less current will be sunk through the transistor 126. This feedback loop enables the charge pump circuit 140 to match currents. The disadvantage is that the charge pump circuit 140 is calibrated with respect to the voltage V- at the intermediate node, but this voltage is not equal to the voltage output by the charge pump circuit 140. As there is almost no current drop across the loop filter 138, then the output voltage V+ of the charge pump circuit 140 will equal the output voltage VTUNE of the loop filter 138. If the current mismatch is not calibrated with respect to V+ there will also be inaccuracies in the output of the loop filter 138.

SUMMARY

It is therefore an objective of the present invention to provide a charge pump circuit that is capable of reducing a current mismatch, by calibrating the current source and current sink.

An exemplary embodiment of a charge pump circuit according to the present invention is provided. The charge pump circuit comprises: a first current providing circuit, for providing a current source to the charge pump circuit; a second current providing circuit, for providing a current sink to the charge pump circuit; a dummy current path, coupled between the first current providing circuit and the second current providing circuit, comprising a first switch element, a second switch element, and a first junction node between the first switch element and the second switch element; a first capacitor, coupled to the first junction node; a normal current path, coupled between the first current providing circuit and the second current providing circuit, comprising a third switch element, a fourth switch element, and a second junction node between the third switch element and the fourth switch element; a second capacitor, coupled to the second junction node; a voltage follower, coupled to the second junction node of the normal current path; a switch, coupled between an output node of the voltage follower and the first junction node of the dummy current path; wherein when the switch is switched on in a first period, a first voltage is at the first junction node and the second junction node, and when the switch is switched off in a second period, the first voltage is at the second junction node and a second voltage is at the first junction node; and a calibration circuit, coupled to the first junction node of the dummy current path and the output node of the voltage follower, for comparing the first voltage and the second voltage to balance a current mismatch between the current source and the current sink.

A method is also provided. The method comprises: providing a voltage follower coupled to the second junction node; providing a switch coupled between the first junction node and the voltage follower; inputting a current source to the first current providing circuit; inputting a current sink to the second current providing circuit; switching on the switch in a first time period to obtain a first voltage at the first junction node and the second junction node; switching off the switch in a second time period to obtain a second voltage at the first junction node; and comparing the first voltage and the second voltage to balance a current mismatch between the current source and the current sink.

A phase locked loop system implementing the exemplary embodiment of the charge pump circuit detailed above is also provided. The phase locked loop system comprises: a phase comparator for receiving a reference clock signal and a clock signal, and for comparing a phase of the reference clock signal with a phase of the clock signal so as to output a phase difference signal; a charge-pump circuit capable of calibrating a current mismatch for producing an output current which depends on the phase difference signal; a loop filter for converting the output current of the charge-pump circuit into an output voltage; and a voltage controlled oscillator for generating a signal having a frequency which depends on the output voltage of the loop filter as a clock signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
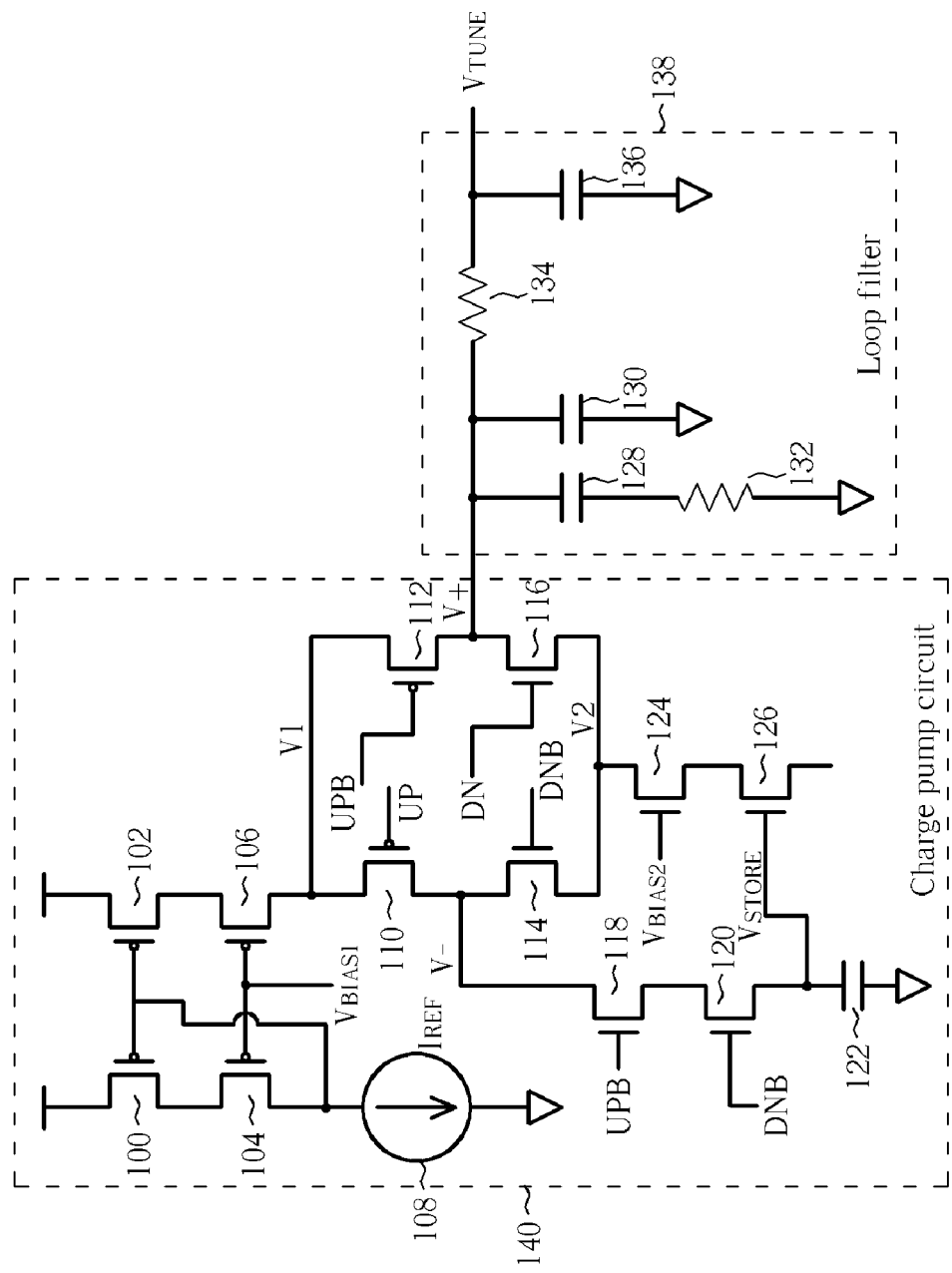
FIG. 1 is a diagram of a charge pump circuit according to the related art.
Figure 2:
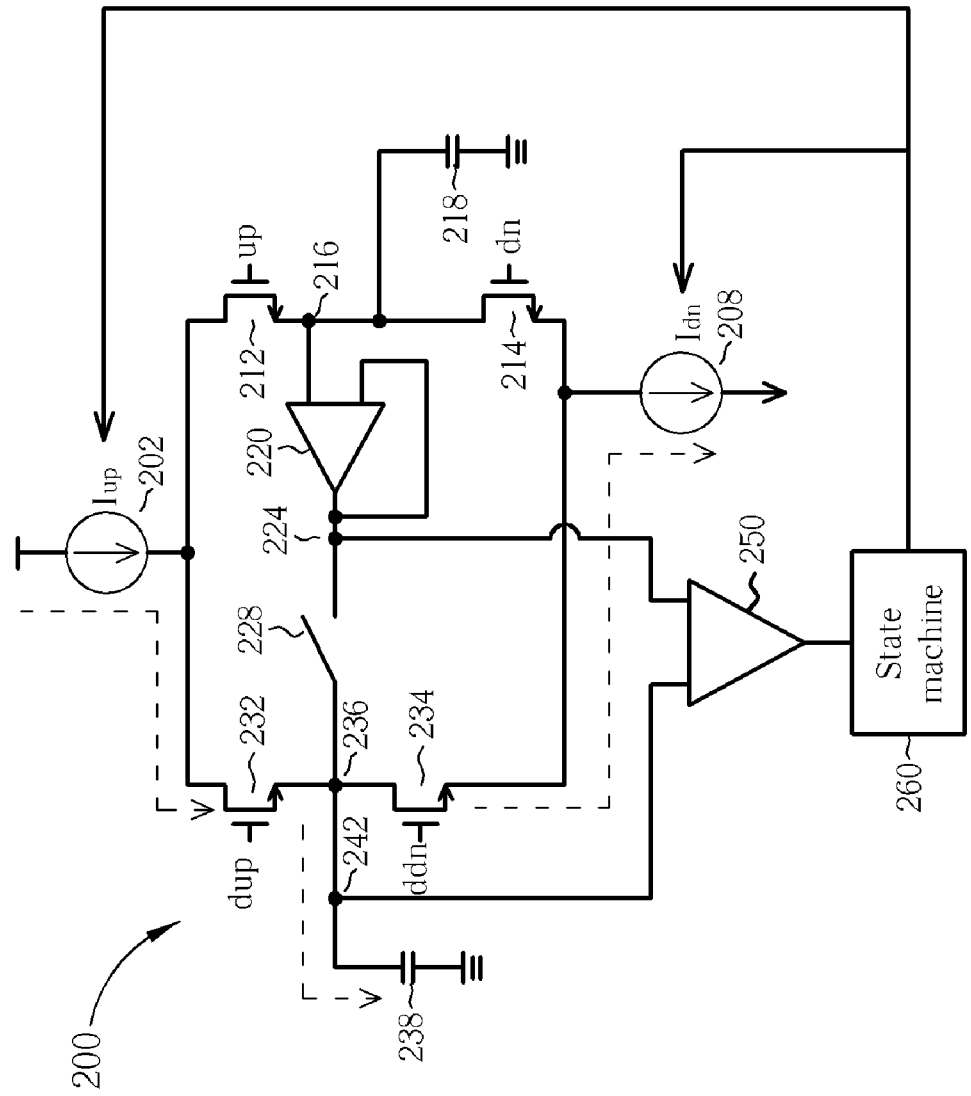
FIG. 2 is a diagram of a charge pump circuit according to an embodiment of the present invention.

Please refer to FIG. 2. FIG. 2 is a diagram of a charge pump circuit 200 according to an exemplary embodiment of the present invention. The charge pump system 200 comprises a first current providing circuit 202, for providing a current source $I_{up}$ and a second current providing circuit 208, for providing a current sink $I_{down}$. A dummy current path is coupled between the first current providing circuit 202 and the second current providing circuit 208, the dummy current path comprising a first switch element 232 coupled to a second switch element 234. The dummy current path further comprises a first junction node 236 coupled between the first and the second switch elements 232, 234, wherein the first junction node 236 is further coupled to a first capacitor 238.

A normal current path is coupled between the first current providing circuit 202 and the second current providing circuit 208, comprising a third switch element 212 coupled to a fourth switch element 214. The normal current path further comprises a second junction node 216 coupled between the third and the fourth switch elements 212, 214, wherein the second junction node 216 is further coupled to a second capacitor 218.

A switch 228 is coupled to the first junction node 236. A voltage follower 220 is coupled to the second junction node 216. The switch 228 is coupled to the output of the voltage follower 220. In this embodiment the switch 228 is a CMOS and the voltage follower 220 is an amplifier, but these are not limitations of the disclosed charge pump 200. The first junction node 236 and the second junction node 216 are coupled to a comparator 250, which is in turn coupled to a state machine 260. Please note that the first junction node 236 is coupled to the comparator through the node 242.

Figure 5:
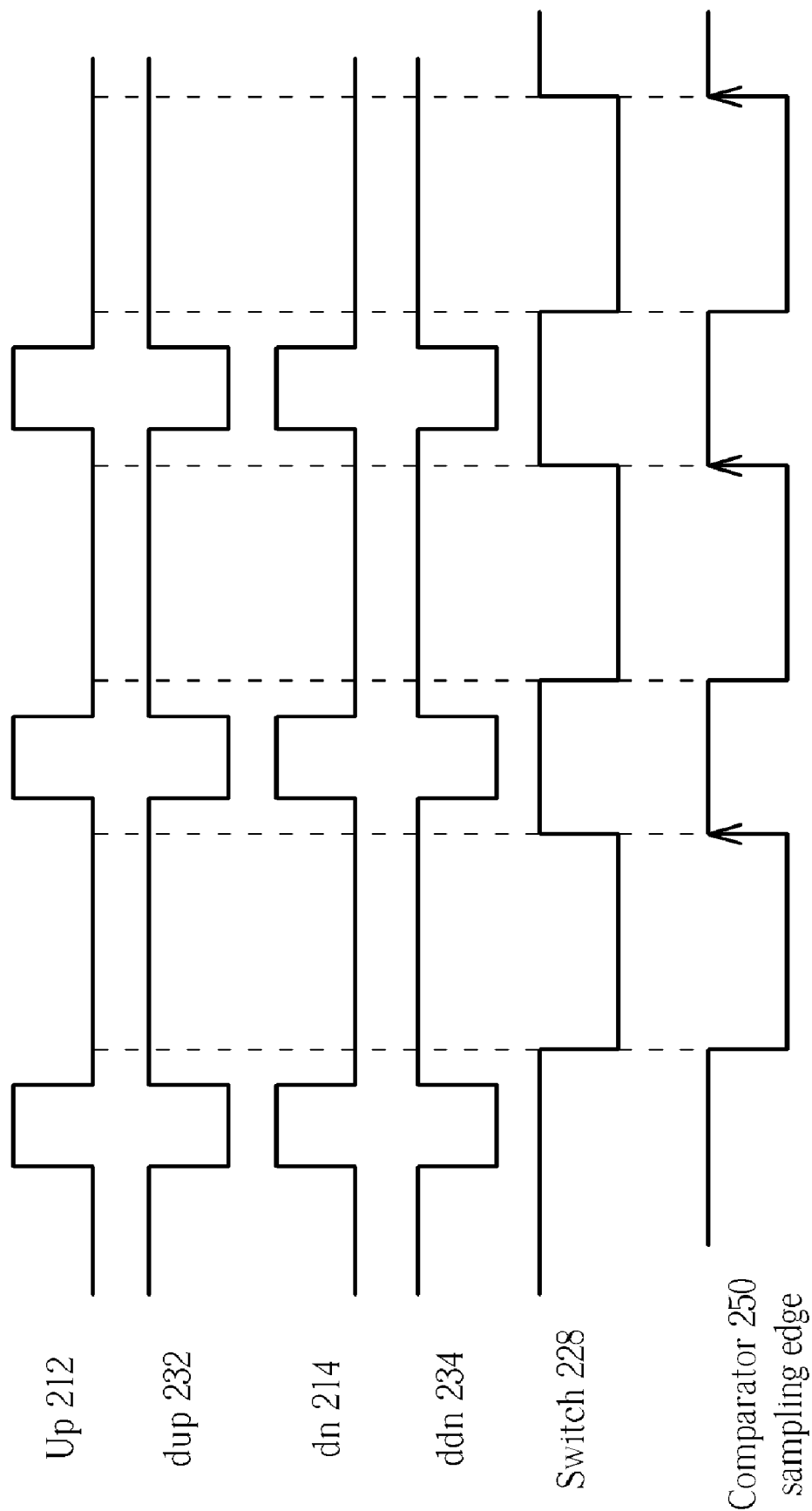
FIG. 5 is a timing diagram of certain components of the charge pump circuit shown in FIG. 2.

Please refer to FIG. 5 in conjunction with FIG. 2. FIG. 5 is a timing diagram of the switch 228, the first switch element 232, the second switch element 234, the third switch element 212, the fourth switch element 214, and the comparator 250. As is well known in the art, when the normal current path is on, the dummy current path will be off, and vice versa. When the normal current path is on, the switch 228 will also be on (i.e. closed). An up pulse is inputted to the first current providing circuit 202, for passing the current source $I_{up}$ through the third switch element 212 and charging the second capacitor 218. When a down pulse is inputted to the second current providing circuit 208, the current sink $I_{down}$ will be passed through the fourth switch element 214, discharging the second capacitor 218. If $I_{up}=I_{down}$ there will be no charge across the second capacitor 218. If there is a current mismatch, there will be a first voltage present at the second junction node 216. As is well known, the function of the voltage follower 220 is to ensure that an output voltage of the voltage follower 220 is the same as an input voltage. The first voltage will therefore also be present at the output node 224 of the voltage follower 220. Due to the connection of the switch 228, the first voltage will additionally be present at the first junction node 236 and the node 242.

The switch 228 still remains closed, as can be seen from FIG. 5. An up pulse is inputted to the first current providing circuit 202, for passing the current source $I_{up}$ through the first switch element 232 and charging the first capacitor 238. The voltage at the first junction node 236 is still equal to the voltage at the second junction node 216. When a down pulse is inputted to the second current providing circuit 208, the current sink $I_{down}$ will be passed through the second switch element 234, discharging the first capacitor 238. At this stage, the switch 228 will be opened, disconnecting the output node 224 of the voltage follower 220 from the first junction node 236. Please note that the switch element is opened after the dummy path is turned on, in order to allow the capacitor 238 to discharge before calibration takes place. As there is a current mismatch, there will now be a second voltage at the first junction node 236, wherein the second voltage is equal to twice the first voltage.

The first voltage and the second voltage will then be input to the comparator 250, which compares the two voltages to generate a corresponding logic level. As can be seen from FIG. 5, the comparator 250 sampling edge corresponds to the period when the switch 228 is open. If $I_{Up}>I_{down}$ the comparator 250 will generate a high logic level. If $I_{up}<I_{down}$ the comparator 250 will generate a low logic level. The logic level is inputted to the state machine 260, which utilizes the comparator result to selectively input a calibrating current to the first current providing circuit 202 or the second current providing circuit 208. The high logic level informs the state machine 260 to input a low current level to the current sink, and a low logic level informs the state machine 260 to input a high current level to the current source. As can be seen from FIG. 5, the calibration is completed before the normal current path is turned on again, i.e. the comparator sampling edge time is shorter than the active period of the dummy current path.

Please note that the magnitude of the calibrating current is not a fixed value, and can be altered depending on the constraints of the particular charge pump system. As such, calibration may occur over several charging intervals. The number of charging intervals, and the magnitude of a calibrating current are not limitations of the present invention, and various modifications can be made without altering the scope of the current disclosure.

Figure 3:
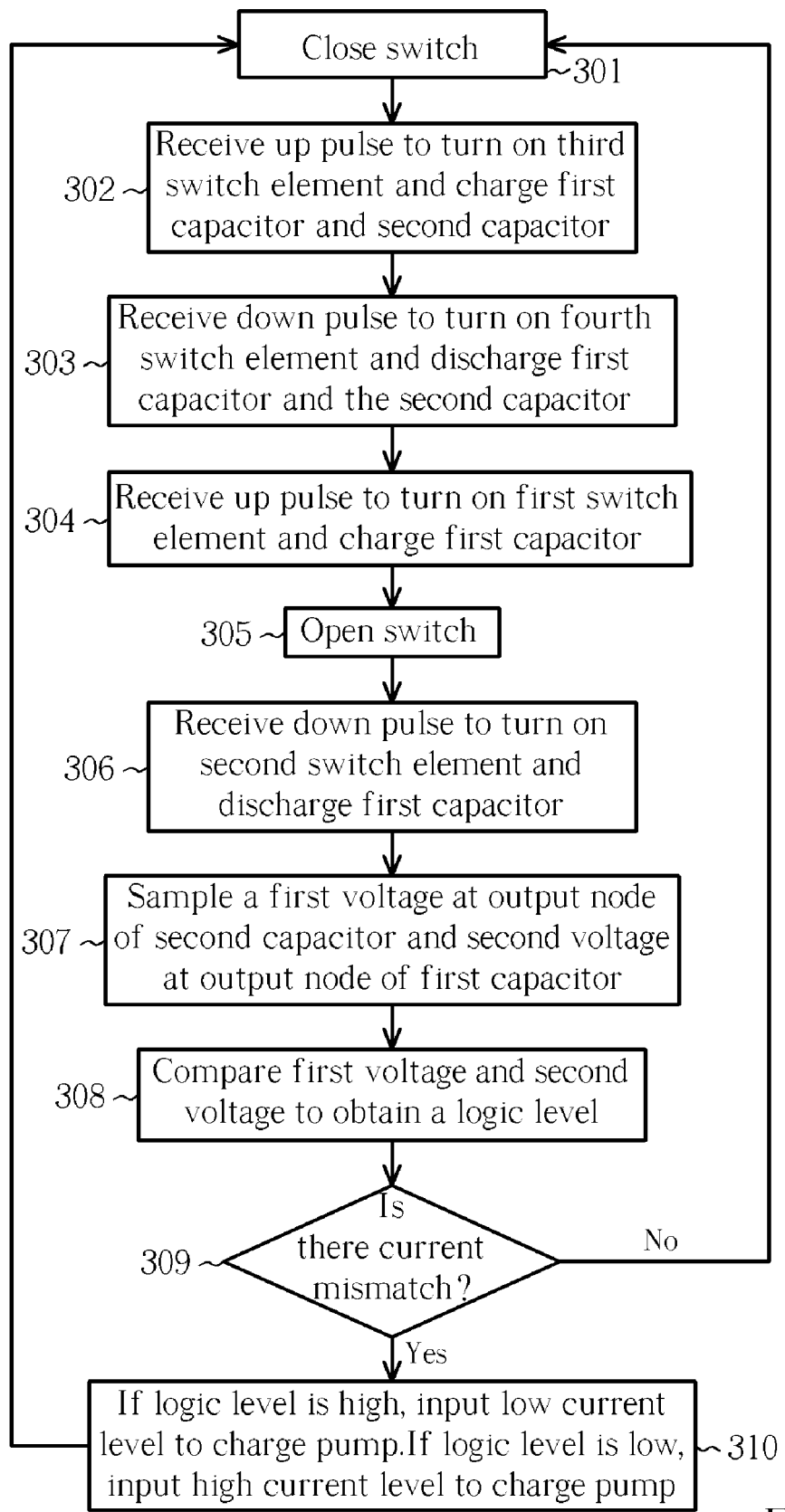
FIG. 3 is a flowchart of a method according to an embodiment of the present invention.

Please refer to FIG. 3. FIG. 3 is a flowchart of a charge pump calibration method, according to the embodiment of the present invention detailed above. The steps are as follows:

Step 301: Close the switch 228;

Step 302: Receive up pulse to turn on the third switch element 212 and charge the first capacitor 238 and the second capacitor 218;

Step 303: Receive down pulse to turn on the fourth switch element 214 and discharge the first capacitor 238 and the second capacitor 218;

Step 304: Receive up pulse to turn on the first switch element 232 and charge the first capacitor 238;

Step 305: Open the switch 228;

Step 306: Receive down pulse to turn on the second switch element 234 and discharge the first capacitor 238;

Step 307: Sample a first voltage at the output node 242 of the second capacitor 238 and a second voltage at the output node 216 of the first capacitor 218;

Step 308: Compare the first voltage and the second voltage to obtain a logic level;

Step 309: Is there a current mismatch? If yes go to Step 310; if no go back to Step 301;

Step 310: If the logic level is a high logic level then input a low current level to the charge pump 200; if the logic level is a low logic level then input a high current level to the charge pump 200. Go back to Step 301.

Figure 4:
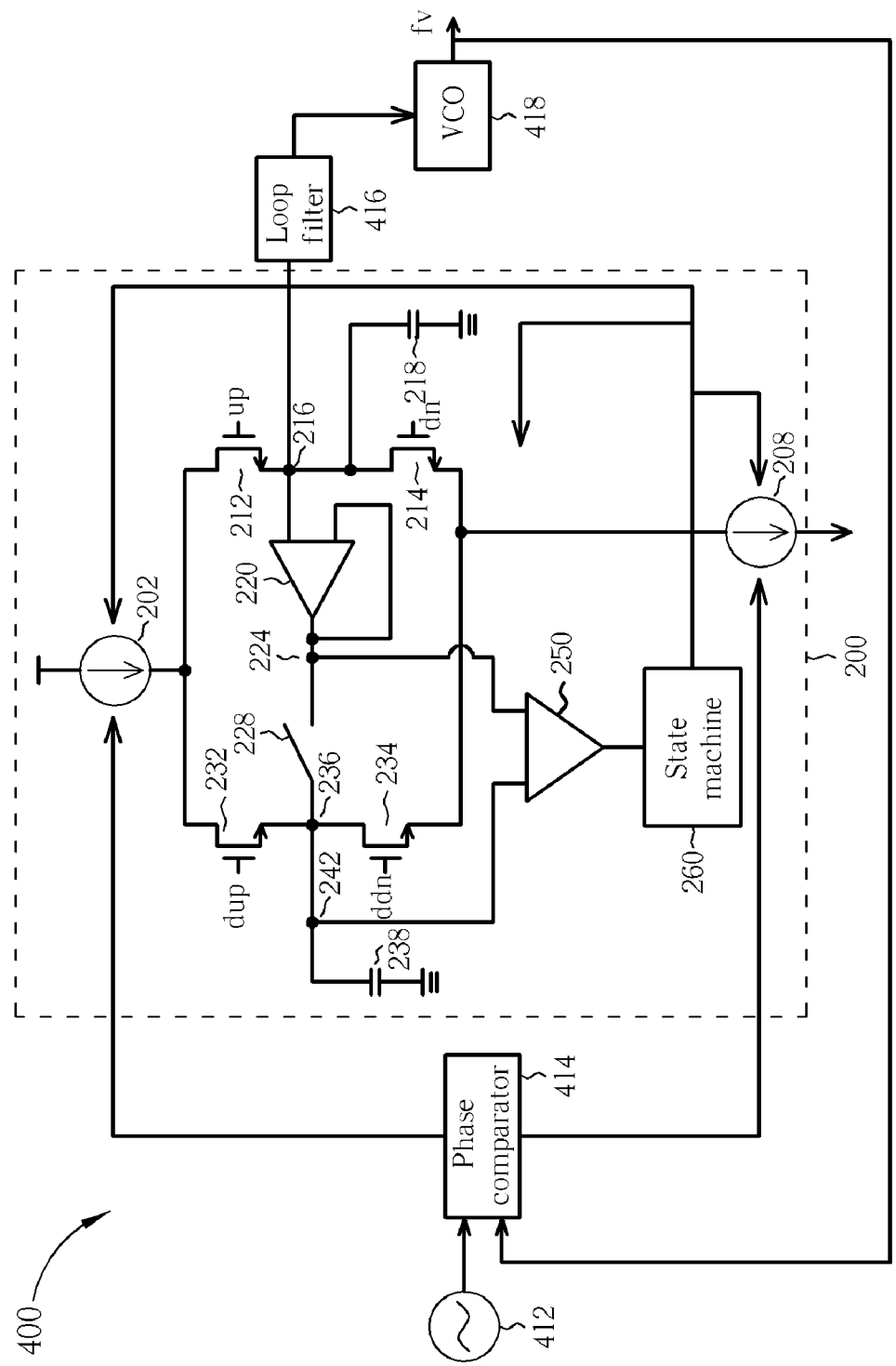
FIG. 4 is a diagram of a phase locked loop system implementing the charge pump circuit shown in FIG. 2.

The disclosed charge pump circuit 200 can be implemented in a phase locked loop (PLL) system, for increasing the accuracy of the PLL system. Please refer to FIG. 4. FIG. 4 is a diagram of a phase locked loop system 400 implementing the charge pump circuit 200. Please note that the charge pump circuit 200 shown in FIG. 4 is identical to the charge pump circuit 200 shown in FIG. 2. As a detailed description of the charge pump circuit 200 is given above, and the function of a PLL system is well known to those skilled in the art, further operational details are omitted for brevity.

The disclosed charge pump circuit 200 overcomes the disadvantages of the related art, by providing a system where the associated voltage of the current source can be directly calibrated with the associated voltage of the current sink. Furthermore, utilizing the comparator 250 to obtain a logic level relating to the current mismatch only requires simple calculation processes. Additionally, the disclosed charge pump circuit 200 does not require complex components, or a largely increased circuit area.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A charge pump circuit, comprising:
   a first current providing circuit, for providing a current source to the charge pump circuit;
   a second current providing circuit, for providing a current sink to the charge pump circuit;
   a dummy current path, coupled between the first current providing circuit and the second current providing circuit, comprising a first switch element, a second switch element, and a first junction node between the first switch element and the second switch element;
   a first capacitor, coupled to the first junction node;
   a normal current path, coupled between the first current providing circuit and the second current providing circuit, comprising a third switch element, a fourth switch element, and a second junction node between the third switch element and the fourth switch element;
   a second capacitor, coupled to the second junction node;
   a voltage follower, coupled to the second junction node of the normal current path;
   a switch, coupled between an output node of the voltage follower and the first junction node of the dummy current path; wherein when the switch is switched on in a first period, a first voltage is at the first junction node and the second junction node, and when the switch is switched off in a second period, the first voltage is at the second junction node and a second voltage is at the first junction node; and
   a calibration circuit, coupled to the first junction node of the dummy current path and the output node of the voltage follower, for comparing the first voltage and the second voltage to balance a current mismatch between the current source and the current sink, the calibration circuit comprising:
      a comparator, coupled to the first junction node and the second junction node, for comparing the first voltage and the second voltage to generate a corresponding logic level; and
      a state machine, coupled to the comparator, for inputting a calibrating current to the first current providing circuit and the second current providing circuit according to the logic level.

2. The charge pump circuit of claim 1, wherein the switch is a CMOS transistor.

3. The charge pump circuit of claim 1, wherein if the logic level is a high logic level, the state machine will input a low current level to the second current providing circuit, and if the logic level is a low logic level, the state machine will input a high current level to the first current providing circuit.

4. The charge pump circuit of claim 1, wherein the amount of the calibrating current is dependent on the charge pump circuit.

5. The charge pump circuit of claim 1, wherein the voltage follower is an amplifier.

6. A method for calibrating a current mismatch in a charge pump circuit, wherein the charge pump comprises a first current providing circuit, a second current providing circuit, a dummy current path coupled between the first current providing circuit and the second current providing circuit, and a normal current path coupled between the first current providing circuit and the second current providing circuit, the dummy current path comprises a first junction node, and the normal path comprises a second junction node, the method comprising:
   providing a voltage follower coupled to the second junction node;
   providing a switch coupled between the first junction node and the voltage follower;
   inputting a current source to the first current providing circuit;
   inputting a current sink to the second current providing circuit;
   switching on the switch in a first time period to obtain a first voltage at the first junction node and the second junction node;
   switching off the switch in a second time period to obtain a second voltage at the first junction node; and
   comparing the first voltage and the second voltage to balance a current mismatch between the current source and the current sink, comprising:
      comparing the first voltage and the second voltage to generate a corresponding logic level; and
      inputting a calibrating current to the first current providing circuit and the second current providing circuit according to the logic level.

7. The method of claim 6, wherein the step of providing a switch coupled between the first junction node and the voltage follower comprises:
   providing a CMOS transistor coupled between the first junction node and the voltage follower.

8. The method of claim 6, wherein the step of inputting a calibrating current to the first current providing circuit and the second current providing circuit according to the logic level comprises:
   if the logic level is a high logic level, inputting a low current level to the second current providing circuit, and if the logic level is a low logic level, inputting a high current level to the first current providing circuit.

9. The method of claim 6, wherein the amount of the calibrating current is dependent on the charge pump circuit.

10. The method of claim 6, wherein the step of providing a voltage follower coupled to the second junction node comprises:

provinding an amplifier coupled to the second junction node.

11. A phase locked loop system, comprising:

a phase comparator for receiving a reference clock signal and a clock signal, and for comparing a phase of the reference clock signal with a phase of the clock signal so as to output a phase difference signal;

a charge-pump circuit capable of calibrating a current mismatch for producing an output current which depends on the phase difference signal;

a loop filter for converting the output current of the charge-pump circuit into an output voltage; and a voltage controlled oscillator for generating a signal having a frequency which depends on the output voltage of the loop filter as a clock signal;

wherein the charge pump circuit comprises:

a first current providing circuit, for providing a current source to the charge pump circuit;

a second current providing circuit, for providing a current sink to the charge pump circuit;

a dummy current path, coupled between the first current providing circuit and the second current providing circuit, comprising a first switch element, a second switch element, and a first junction node between the first switch element and the second switch element;

a first capacitor, coupled to the first junction node;

a normal current path, coupled between the first current providing circuit and the second current providing circuit, comprising a third switch element, a fourth switch element, and a second junction node between the third switch element and the fourth switch element;

a second capacitor, coupled to the second junction node;

a voltage follower, coupled to the second junction node of the normal current path;

a switch, coupled between an output node of the voltage follower and the first junction node of the dummy current path; wherein when the switch is switched on in a first period, a first voltage is at the first junction node and the second junction node, and when the switch is switched off in a second period, the first voltage is at the second junction node and a second voltage is at the first junction node; and a calibration circuit, coupled to the first junction node of the dummy current path and the output node of the voltage follower, for comparing the first voltage and the second voltage to balance a current mismatch between the current source and the current sink, the calibration circuit comprising:

a comparator, coupled to the first junction node and the second junction node, for comparing the first voltage and the second voltage to generate a corresponding logic level; and a state machine, coupled to the comparator, for inputting a calibrating current to the first current providing circuit and the second current providing circuit according to the logic level.

12. The phase locked loop system of claim 11, wherein the switch is a CMOS transistor.

13. The phase locked loop system of claim 11, wherein if the logic level is a high logic level, the state machine will input a low current level to the second current providing circuit, and if the logic level is a low logic level, the state machine will input a high current level to the first current providing circuit.

14. The phase locked loop system of claim 11, wherein the amount of the calibrating current is dependent on the charge pump circuit.

15. The phase locked loop system of claim 11, wherein the voltage follower is an amplifier.

* * * * *